(12) United States Patent
Hong

(10) Patent No.: US 7,713,827 B2
(45) Date of Patent: May 11, 2010

(54) METHOD FOR MANUFACTURING SEMICONDUCTOR DEVICE

(75) Inventor: Yeong Eui Hong, Seongnam-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 269 days.

(21) Appl. No.: 11/935,032

(22) Filed: Nov. 5, 2007

(65) Prior Publication Data

US 2009/0004815 A1    Jan. 1, 2009

(30) Foreign Application Priority Data

Jun. 29, 2007    (KR) ...................... 10-2007-0065559

(51) Int. Cl.
*H01L 21/336* (2006.01)
*H01L 21/76* (2006.01)
(52) U.S. Cl. ................. 438/296; 438/425; 257/E21.54; 257/E21.618; 257/E21.621
(58) Field of Classification Search ................. 438/425, 438/296, 275; 257/E21.54, E21.429, E21.618, 257/E21.621, E21.655
See application file for complete search history.

(56) References Cited

U.S. PATENT DOCUMENTS

| 2003/0071321 | A1* | 4/2003 | Hong | .......................... 438/429 |
| 2005/0266648 | A1* | 12/2005 | Chung et al. | ................ 438/296 |
| 2006/0043525 | A1* | 3/2006 | Mouli | ........................ 257/520 |

FOREIGN PATENT DOCUMENTS

KR    10-2006-0067302    6/2006

\* cited by examiner

*Primary Examiner*—Walter L Lindsay, Jr.
(74) *Attorney, Agent, or Firm*—Marshall, Gerstein & Borun LLP

(57) ABSTRACT

Disclosed herein is a method of making a semiconductor device. According to the method, a flowable oxide (FOX) is deposited over a semiconductor substrate, and a local active region is exposed to grow an active region, by a silicon epitaxial growth (SEG) method, to prevent generation of a void when a device isolation structure is formed by a Shallow Trench Isolation (STI) method, and to prevent formation of stress between the semiconductor substrate and the FOX.

7 Claims, 6 Drawing Sheets

METHOD FOR MANUFACTURING SEMICONDUCTOR DEVICE

CROSS-REFERENCE TO RELATED APPLICATION

The present application claims the benefit of priority to Korean patent application number 10-2007-0065559, filed on Jun. 29, 2007, the disclosure of which is incorporated herein by reference.

BACKGROUND OF THE INVENTION

1. Field of the Invention

The present invention generally relates to a method for manufacturing a semiconductor device, and more specifically, to a method for manufacturing a semiconductor device that includes depositing a flowable oxide (FOX) dielectric material over a semiconductor substrate, and exposing a local active region to grow an active region by a Silicon Epitaxial Growth (SEG) method to prevent generation of a void when a device isolation structure is formed and to prevent stress between the semiconductor substrate and the FOX dielectric material.

2. Brief Description of Related Technology

Due to high-integration of semiconductor devices, a critical dimension CD of a gate becomes smaller, and a channel length is reduced, which causes a short channel effect (SCE) to degrade an electric characteristic of a field effect transistor (FET).

To prevent the SCE, a Multi-channel Field Effect Transistor (McFET) having a multi channel gate, such as a recessed gate, has been used. The recessed gate is obtained by etching a given depth of an active region of a semiconductor substrate to increase a channel length.

The high-integration of semiconductor devices reduces a process margin for forming an active region and a device isolation structure.

Because a gap between device isolation structures that define an active region becomes smaller, a dielectric material which is a flowable oxide (FOX) for filling a trench of a device isolation structure formed by a Shallow Trench Isolation (STI) method is used in a current single High Density Plasma (HDP), and a Spin On Dielectric (SOD), a HDP Bi layer or other materials are filled.

A trench for forming a device isolation structure is narrow to generate a void when the trench is filled with a dielectric material. A transistor characteristic is degraded by a stress of the dielectric material.

BRIEF SUMMARY OF THE INVENTION

Disclosed herein is a method for manufacturing a semiconductor device. The method generally includes depositing a dielectric material, over a semiconductor substrate, and exposing a local active region to grow an active region by a Silicon Epitaxial Growth (SEG) method. The disclosed method prevents generation of a void when a device isolation structure is formed, and also prevents formation of stress between the semiconductor substrate and the dielectric material.

According to one embodiment, the method includes forming a first stack layer of a first oxide film and a first nitride film over a semiconductor substrate. The method also includes forming a dielectric layer over the first nitride film; selectively etching the dielectric layer of the first nitride film and the first oxide film to form a first recess exposing the semiconductor substrate. The method further includes forming a second stack layer of a second nitride film and a second oxide film over a side wells of the first recess. Still further, the method also includes growing an epitaxial layer in the bottom of the first recess to form an active region. The method also includes forming a second recess in the active region to form a recess gate.

Additional features of the disclosed invention may become apparent to those skilled in the art from a review of the following detailed description, taken in conjunction with the drawings and the appended claims.

BRIEF DESCRIPTION OF THE DRAWINGS

For a more complete understanding of the disclosure, reference should be made to the following detailed description and accompanying drawing wherein.

Figure 1A:
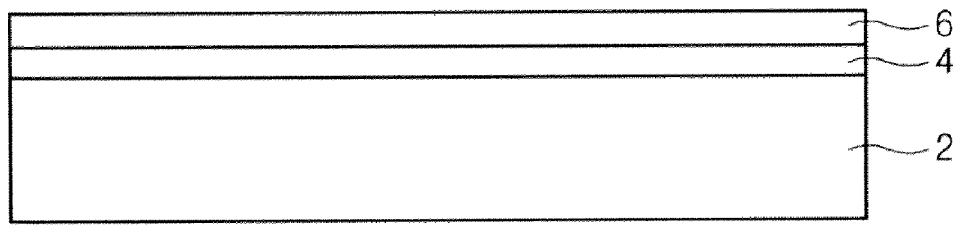
FIGS. 1a through 1l are cross-sectional diagrams illustrating a method for manufacturing a semiconductor device consistent with an embodiment of the present invention.

While the disclosed method is susceptible of embodiments in various forms, there are illustrated in the drawings (and will hereafter be described) specific embodiments of the invention, with the understanding that the disclosure is intended to be illustrative, and is not intended to limit the invention to the specific embodiments described and illustrated herein.

DETAILED DESCRIPTION OF PREFERRED EMBODIMENTS

The present invention will be described in detail with reference to the accompanying drawings.

FIGS. 1a through 1l are cross-sectional diagrams illustrating a method for manufacturing a semiconductor device consistent with an embodiment of the present invention.

Referring to FIG. 1a, a thermal oxidation process is performed on a semiconductor substrate 2 to form a first oxide film 4 having a given thickness. A first nitride film 6 is deposited over the first oxide film 4.

Figure 1B:
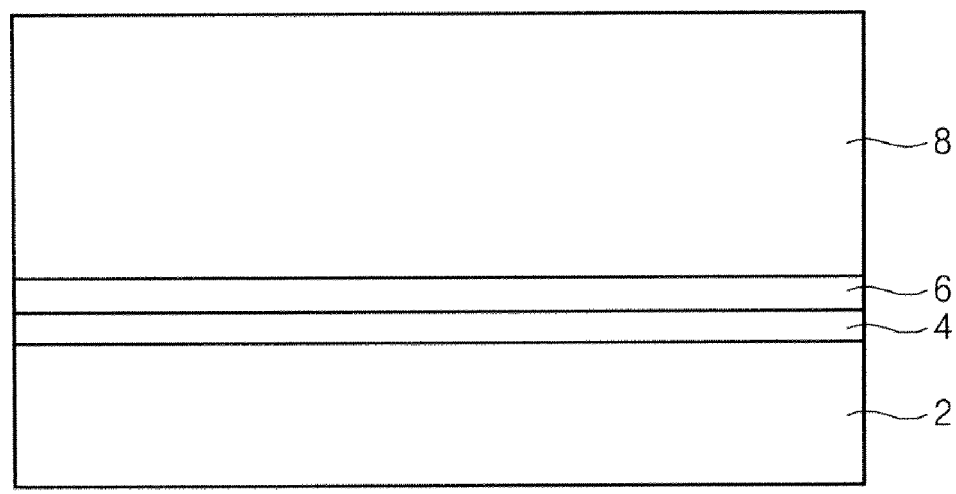
Figure 1C:
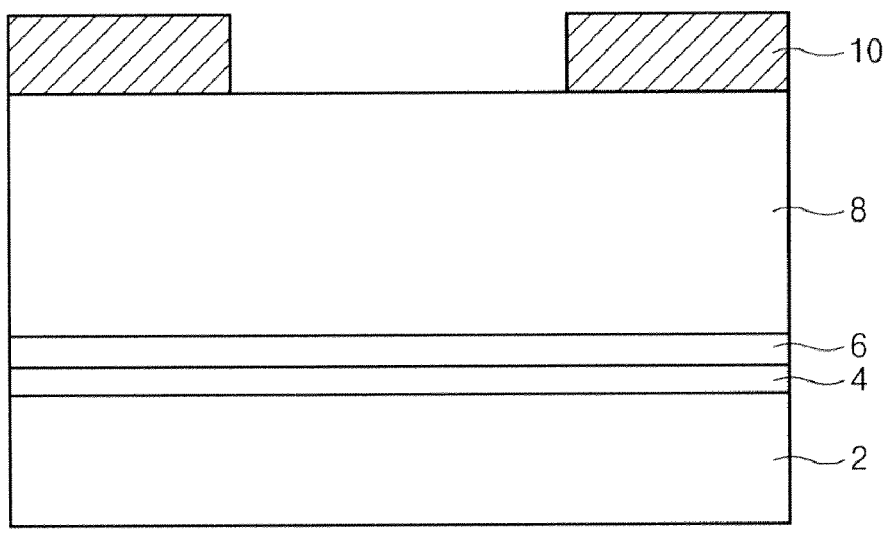

Referring to FIGS. 1b and 1c, a flowable oxide (FOX) 8 is deposited over the first nitride film 6, and a photoresist film is coated over the FOX 8. The FOX 8 includes a dielectric material. An exposure and developing process is performed to form a first photoresist pattern 10 that defines an active region. The first oxide film 4 and the first nitride film 6 are formed to prevent stress between the semiconductor substrate 2 and FOX 8.

Figure 1D:
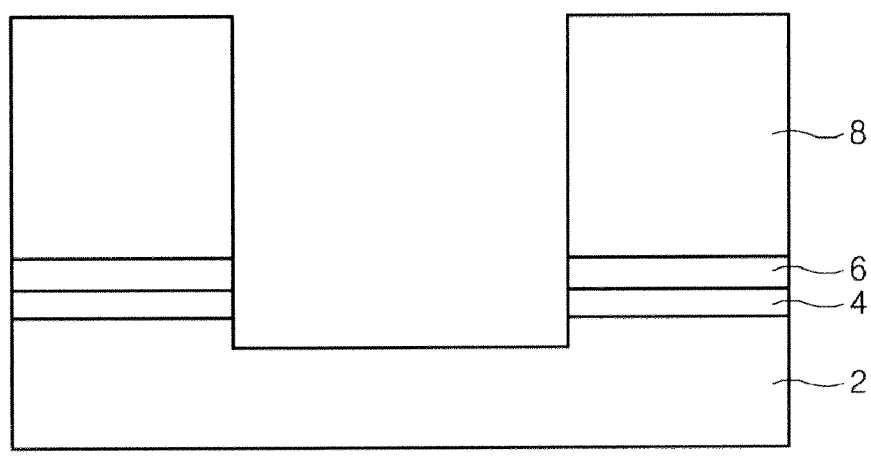

Referring to FIG. 1d, the FOX 8, the first nitride film 6, and the first oxide film 4 are sequentially etched with the first photoresist pattern 10 as an etching mask to expose a local active region of the semiconductor substrate 2, and to remove the first photoresist pattern 10. The semiconductor substrate 2 is over-etched at a given depth.

Figure 1E:
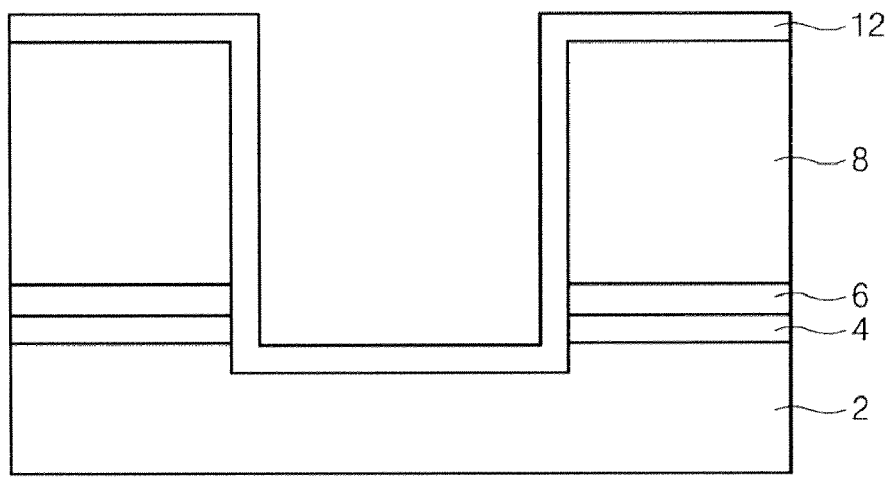
Figure 1F:
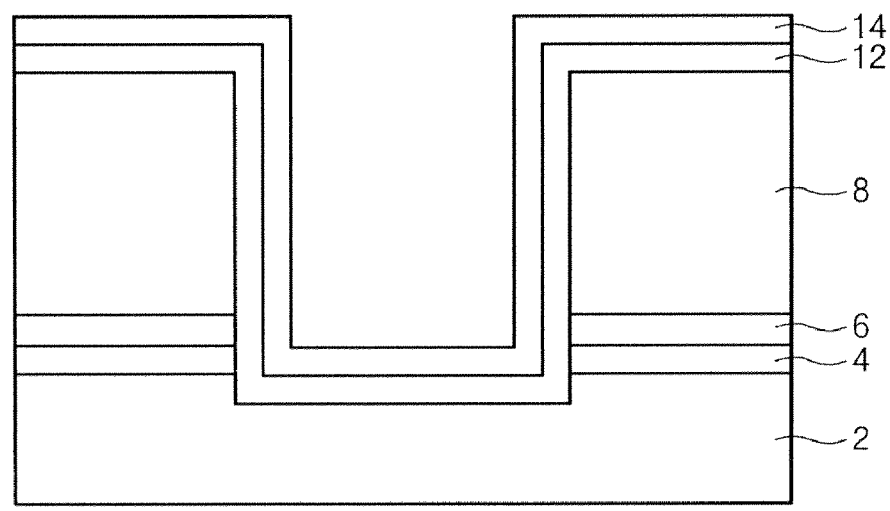

Referring to FIGS. 1e and 1f, a second nitride film 12 and a second oxide film 14 are deposited over the resulting structure including the exposed (local active region) portion of the semiconductor substrate 2.

Figure 1G:
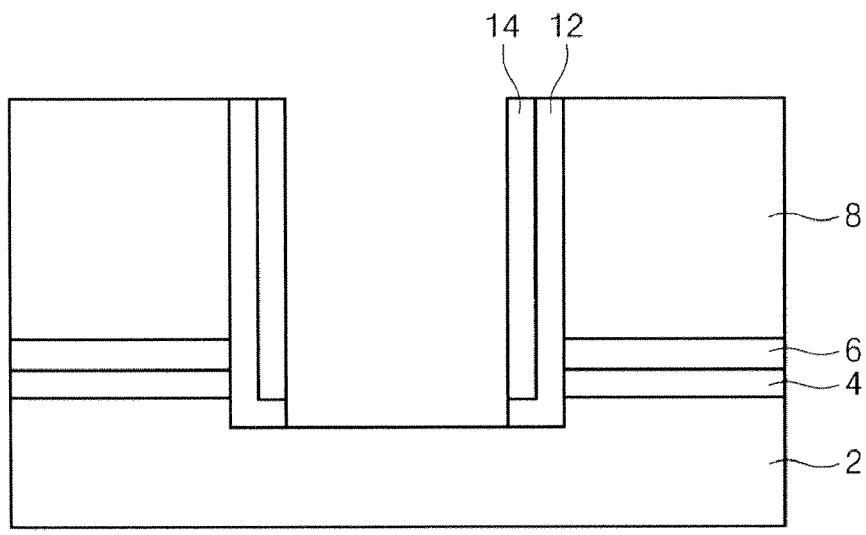

Referring to FIG. 1g, the second oxide film 14 and the second nitride film 12 deposited over the exposed semiconductor substrate 2 and the FOX 8 are sequentially etched by an isotropic etching method such that the second oxide film 12 and the second nitride film 14 remains only at (along) vertical sidewalls of the FOX 8 adjacent the local active region. The second oxide film 12 and the second nitride film 14 that remain at the sidewalls of the FOX 8 prevent stress between the FOX 8 and the active region of the semiconductor substrate 2.

Figure 1H:
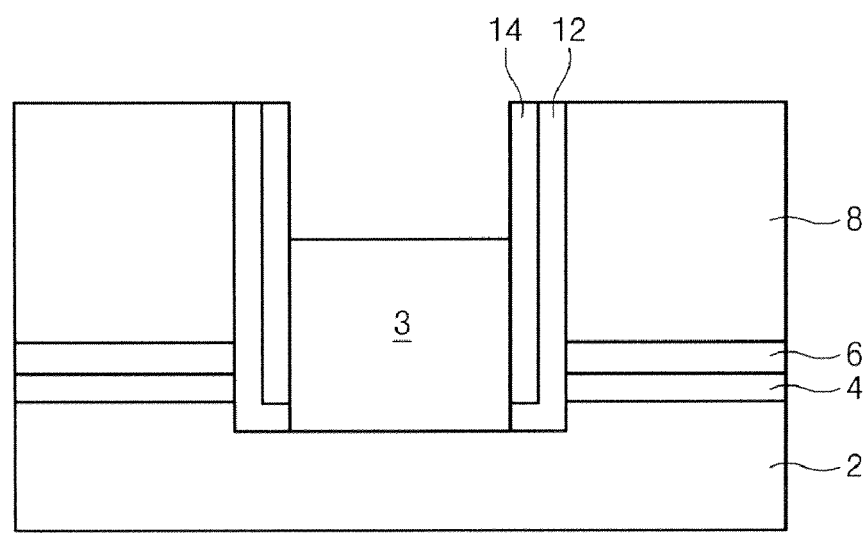

Referring to FIG. 1h, an active region 3 is grown at a desired height in the semiconductor substrate 2 by a Silicon Epitaxial Growth (SEG) method.

Figure 1I:
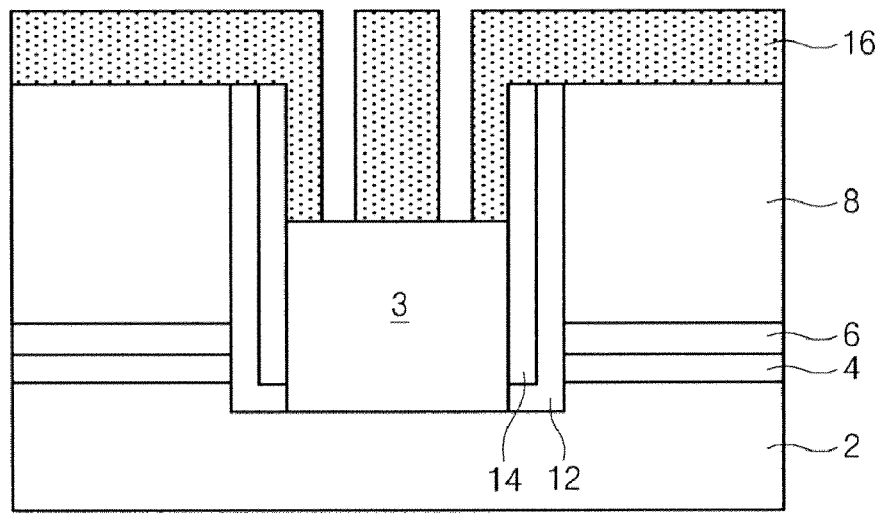

Referring to FIG. 1i, a photoresist film is coated over the resulting structure including the active region 3. An exposure and developing process is performed to form a second photoresist pattern 16 that defines a recess gate region.

Figure 1J:
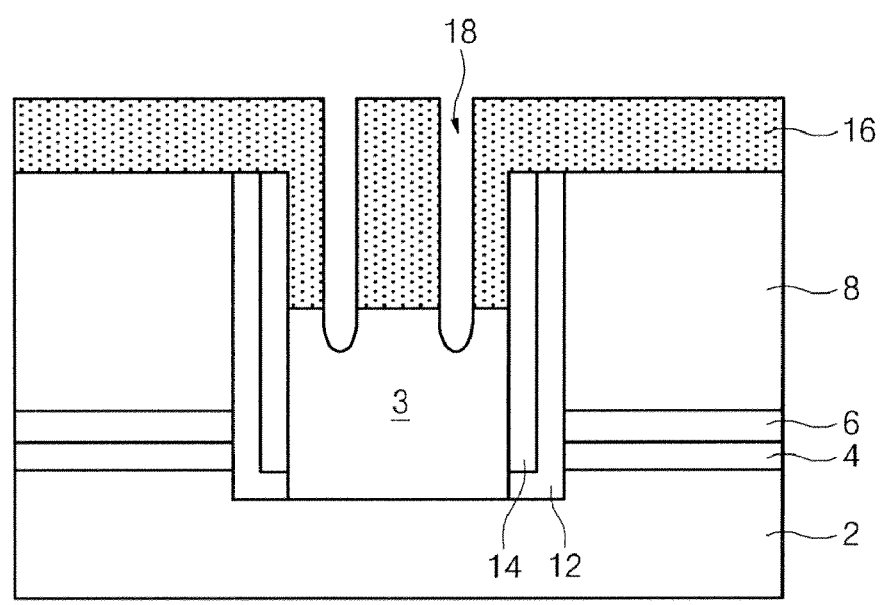

Referring to FIG. 1j, the active region 3 is etched at a given depth with the second photoresist pattern 16 as an etching mask to form a recess gate region 18.

Figure 1K:
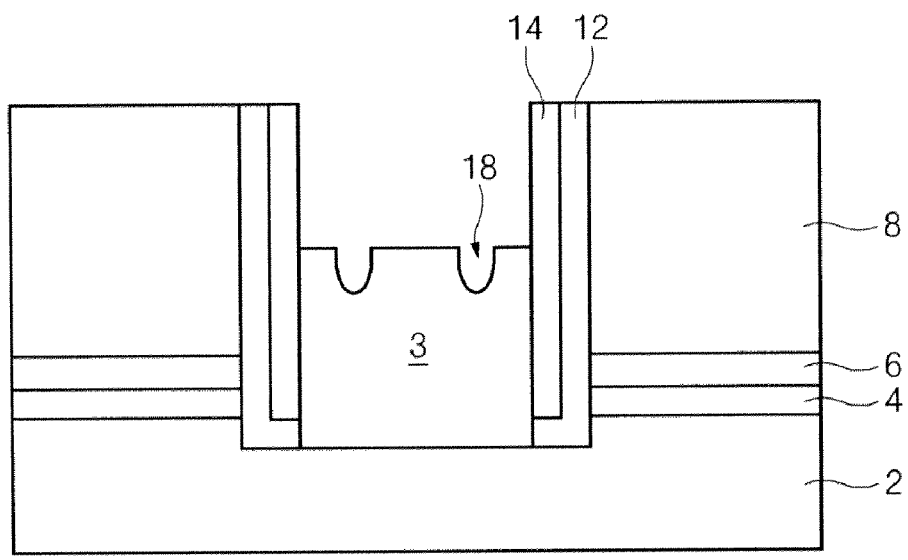
Figure 1L:
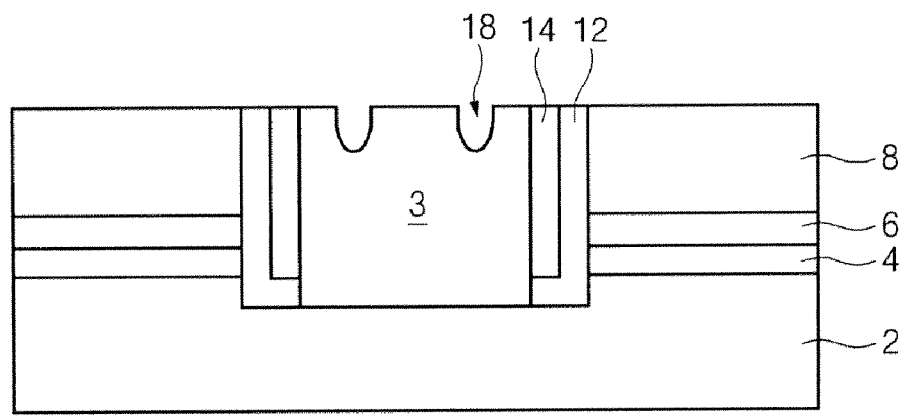

Referring to FIG. 1k, a planarization process is performed on the second nitride film 14 and the second oxide film 12 in order to remove the second photoresist pattern 16 and eliminate a step difference with the active region 3, thereby obtaining a device isolation structure to prevent a void and stress. The planarization process is performed by a Chemical Mechanical Polishing (CMP) process.

As described above, according to an embodiment consistent with the present invention, a flowable oxide (FOX) is deposited over a semiconductor substrate, and a local active region is exposed to grow an active region by a silicon epitaxial growth (SEG) method to prevent a void generated when a device isolation structure is formed by a Shallow Trench Isolation (STI) method and to prevent stress between the semiconductor substrate and the FOX.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device.

What is claimed is:

1. A method for manufacturing a semiconductor device, the method comprising:

forming a first stack layer of a first oxide film and a first nitride film over a semiconductor substrate;

forming a dielectric layer over the first nitride film;

selectively etching the dielectric layer of the first nitride film and the first oxide film to form a first recess exposing the semiconductor substrate;

forming a second stack layer of a second nitride film and a second oxide film over a side wells of the first recess;

performing an epitaxial-growing process from the bottom of the first recess to form an active region surrounded by the dielectric layer; and, forming a second recess in the active region to form a recess gate.

2. The method according to claim 1, wherein the dielectric layer is a flowable oxide (FOX).

3. The method according to claim 1, wherein selectively etching the dielectric layer step further comprises:

coating a photoresist film over the dielectric layer;

performing an exposure and developing process to form a first photoresist pattern defining the local active region; and, sequentially etching the dielectric layer, the first nitride film, and the first oxide film with the first photoresist pattern.

4. The method according to claim 1, wherein the forming a second stack layer step further comprises sequentially etching the second oxide film and the second nitride film on the semiconductor substrate by an anisotropic etching method.

5. The method according to claim 1, wherein the forming a second recess step further comprises:

coating a photoresist film over the structure obtained in the growing an epitaxial layer step;

performing an exposure and developing process to form a second photoresist pattern defining the recess gate region; and, etching the active region with the second photoresist pattern as an etching mask.

6. The method according to claim 1, further comprising:

performing a planarization process on the second nitride film, the second oxide film, and the dielectric layer to remove a step difference with the active region.

7. The method according to claim 6, wherein the planarization process is performed by a Chemical Mechanical Polishing (CMP) process.

* * * * *